United States Patent
Rachui et al.

(10) Patent No.: US 7,043,829 B2
(45) Date of Patent: May 16, 2006

(54) METHOD FOR ASSEMBLY OF A MOTHERBOARD INTO AN INFORMATION HANDLING SYSTEM CHASSIS

(75) Inventors: Roy A. Rachui, Georgetown, TX (US); Mark S. Manley, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 553 days.

(21) Appl. No.: 10/314,811

(22) Filed: Dec. 9, 2002

(65) Prior Publication Data

US 2004/0107566 A1  Jun. 10, 2004

(51) Int. Cl.
*H05K 3/30* (2006.01)

(52) U.S. Cl. .............. 29/834; 29/830; 29/832; 29/739; 29/740; 29/762

(58) Field of Classification Search .......... 29/830, 29/832, 834, 837, 840, 739, 740, 741, 742, 29/762

See application file for complete search history.

(56) References Cited

U.S. PATENT DOCUMENTS

| | | | | |
|---|---|---|---|---|
| 3,310,867 A | * | 3/1967 | Eckstein et al. | 29/831 |
| 4,212,102 A | * | 7/1980 | Drinkard, Jr. | 29/741 |
| 4,528,747 A | * | 7/1985 | Hoffman et al. | 29/834 |
| 4,916,807 A | * | 4/1990 | Wiese | 29/840 |
| 5,718,367 A | * | 2/1998 | Covell et al. | 228/254 |
| 6,267,254 B1 | | 7/2001 | Chen | 211/26 |
| 6,399,887 B1 | | 6/2002 | Lin | 174/138 D |
| 6,708,872 B1 | * | 3/2004 | Gruber et al. | 228/248.1 |
| 2001/0052177 A1 | | 12/2001 | Boe | |

\* cited by examiner

*Primary Examiner*—Richard Chang
(74) *Attorney, Agent, or Firm*—Hamilton & Terrile, LLP; Robert W. Holland

(57) ABSTRACT

A motherboard is assembled into an information handling system by coupling simulated electronic connectors of an assembly platform to electronic connectors of the motherboard to support movement of the motherboard to an installation position in the information handling system chassis. Openings in the assembly platform allow insertion of attachment devices to attach the motherboard to the chassis of the information handling system. Once the motherboard is secured to the chassis, the assembly platform is removed by pulling away from the motherboard to de-couple the simulated electronic connectors of the assembly board from the electronic connectors of the motherboard.

5 Claims, 3 Drawing Sheets

METHOD FOR ASSEMBLY OF A MOTHERBOARD INTO AN INFORMATION HANDLING SYSTEM CHASSIS

BACKGROUND OF THE INVENTION

1. Field of the Invention

The present invention relates in general to the field of information handling system assembly, and more particularly to assembly of a motherboard in an information handling system.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system manufacturers attempt to build powerful information handling systems that have small footprints. Components are carefully arranged within a chassis to function properly given cooling, electromagnetic interference ("EMI") and other constraints while taking up a minimal amount of room. Typically, assembly of information handling system components involves manually securing a motherboard within a chassis by hand and then interfacing the components with each other through the motherboard. For instance, a central processing unit ("CPU") is inserted into a motherboard socket to perform information processing, memory modules are inserted into memory connectors and peripheral devices are interfaced through mating connectors or daughterboard card connector slots. The electronic components are typically shielded to eliminate or reduce EMI by compressing an EMI shield into the chassis during installation of the motherboard.

One difficulty with the assembly of a motherboard into an information handling system chassis is that a restricted amount of room is available for installation of the motherboard. This restricted amount of room makes it difficult to maneuver motherboards into position by hand placement of the motherboard in the chassis. The installation of a motherboard in a small available space increases the risk of damage to the motherboard by the assembler during hand assembly, either due to physical damage to the motherboard by the assembler's hands or by hitting the motherboard against the chassis. Further, the restricted space for assembly makes it difficult for an assembler to secure the motherboard to the chassis, such as by attaching the motherboard to the chassis with screws tightened by a screwdriver. For instance, a screwdriver may damage a motherboard during assembly by slipping off of the screw and hitting the motherboard surface leading to system failure during testing. In addition, motherboards are sensitive to damage caused by static charge introduced either by human touch or by the touch of assembly tools.

SUMMARY OF THE INVENTION

Therefore a need has arisen for a system and method which aids in assembly of a motherboard or other circuit boards into an information handling system chassis.

In accordance with the present invention, a system and method are provided which substantially reduce the disadvantages and problems associated with previous systems and methods for the assembly of a motherboard into an information handling system. A support assembly platform removably couples to a motherboard with one or more simulated electronic connectors that couple to one or more motherboard electronic connectors. The support assembly platform allows movement of the motherboard to an assembly position for installation into an information handling system chassis and then decouples from the assembled motherboard by pulling away from the installed motherboard to release the electronic connectors.

More specifically, the support assembly platform is machined from an anti-static material such as polycarbonate to have a shape similar to the shape of the motherboard. Support handles extend from a support face of the support assembly platform and simulated electronic connectors extend from an assembly face of the support assembly platform. An assembler grasps the support handles and aligns the simulated electronic connectors of the assembly face with the electronic connectors on the outer face of a motherboard. For instance, alignment guides extend from the perimeter of the assembly face to align with the perimeter of a motherboard. The motherboard couples to the support assembly platform by inserting the simulated electronic connectors into the aligned motherboard electronic connectors. An assembler moves the motherboard to an assembly position in an information handling system chassis by moving the support assembly platform with the support handles. The motherboard is installed into the chassis by attachment devices, such as screws, that fit through attachment device openings of the support assembly platform that are aligned with attachment openings of the motherboard. Attachment device guides funnel the attachment devices through the support assembly platform to avoid damaging contact with the motherboard. Once the motherboard is secured to the chassis, pulling up on the support assembly handles removes the support assembly platform from the motherboard by de-coupling the simulated electronic connectors from the motherboard connectors.

The present invention provides a number of important technical advantages. One example of an important technical advantage is that motherboards are physically handled and installed in a chassis through movement of the support assembly platform without an assembler having to directly touch or handle the motherboard, thus reducing the risk of damage due to mishandling or static discharges. The simulated electronic connectors removably couple with existing motherboard electronic connectors so that coupling and de-coupling of the support assembly platform and motherboard is accomplished without additions or changes to the motherboard for assembly purposes. Attachment device openings and guides of the support assembly platform aid in the securing of the motherboard to the chassis with reduced risk of damage to the motherboard due to inadvertent contact from attachment devices or tools. In addition, the support assembly platform provides motherboard installation guidance to assemblers, such as by numbering the attachment device tightening sequence on the support surface and providing openings for components, such as the CPU, which are coupled to the motherboard.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Motherboard assembly into a restricted space of an information handling system chassis is simplified with a support assembly platform that removably couples simulated electronic connectors to motherboard electronic connectors to support movement of the motherboard to an installation position. Once the motherboard is secured to the chassis, the support platform is removed from the information handling system by pulling the simulated electronic connectors from the motherboard electronic connectors to leave the motherboard installed in the information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
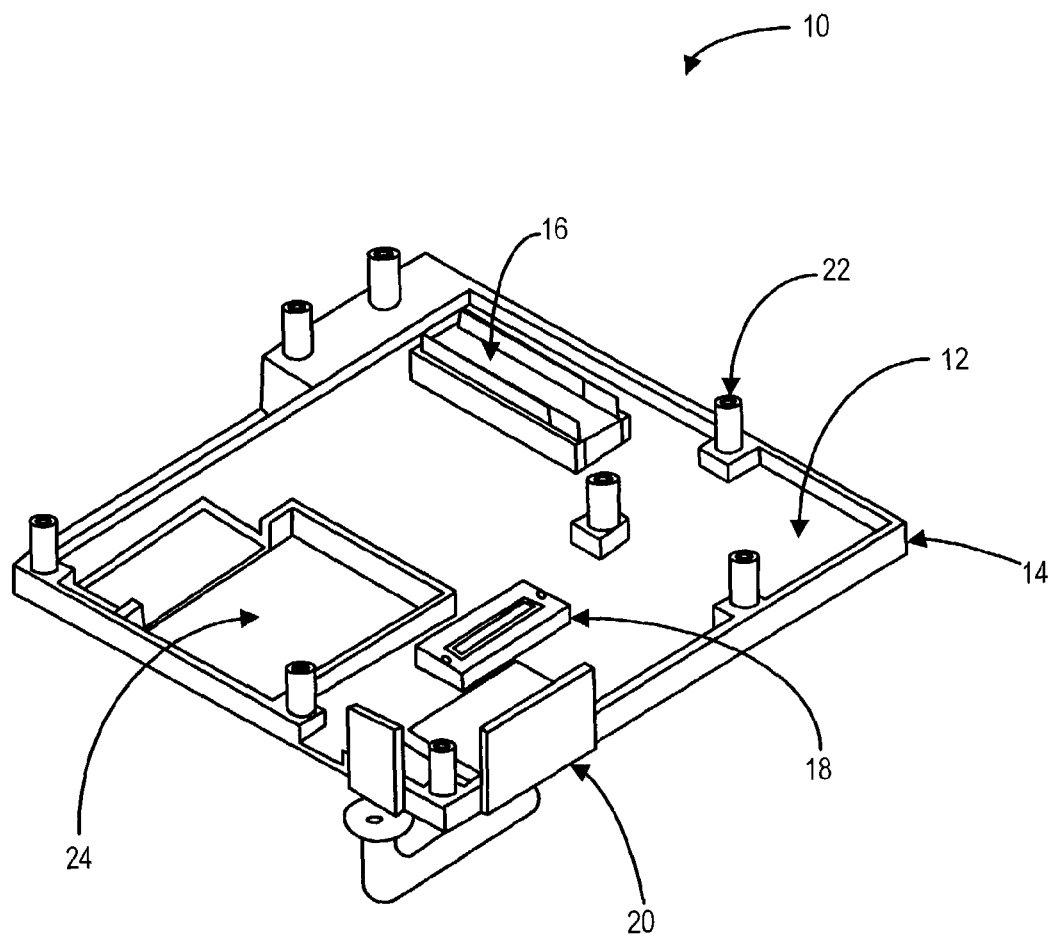
FIG. 1 depicts the assembly face of a motherboard support assembly platform.

Referring now to FIG. 1, an assembly system 10 for assembly of a motherboard into an information handling system chassis is depicted. FIG. 1 depicts an assembly face 12 of a support assembly platform 14 that faces the motherboard to removably couple with motherboard electronic connectors. Assembly platform 14 is made of an anti-static material, such as polycarbonate, that inhibits the accumulation of static electricity to protect electronstatically sensitive motherboard components from damage caused by static electricity discharges. In one embodiment, support assembly platform 14 is made of transparent material to aid an assembler in accurately attaching assembly platform 14 to a motherboard and in accurately placing an attached motherboard in a desired position in an information handling system chassis.

Assembly face 12 of support assembly platform 14 includes simulated electronic connectors to removably couple with a motherboard. For instance, simulated PCI card electronic connectors 16 insert in motherboard PCI card slots to couple support assembly platform 14 to a motherboard. Similarly, a simulated mating connector 18 inserts in a motherboard mating connector, such as is used to communicate with disk drives, to couple support assembly platform 14 to a motherboard. In alternative embodiments, the amount and location of holding force between support assembly platform 14 and an attached motherboard is varied by varying the number and location of simulated electronic components disposed on assembly face 12 of support assembly platform 14.

Assembly platform 14 is aligned with a motherboard by placing alignment guides 20 along the outer perimeter of the motherboard. Once aligned, support assembly platform 14 is removably coupled with the motherboard by pressing to connect simulated electronic connectors 16 and 18 into associated motherboard electronic connectors. Attachment device guides 22 align with attachment device openings of the motherboard and restrict the assembly face from reaching full contact with the motherboard except through the contact of attachment device guides 22 at motherboard attachment points. Attachment device guides 22 are removably coupled to assembly support platform 14, such as by screwing attachment guides 22 into machined openings formed in assembly support platform 14. Other openings formed in assembly support platform 14 aid in the installation of components onto a motherboard. For instance, a CPU opening 24 through assembly support platform 14 allows installation of a CPU and heat sink onto a motherboard after the motherboard is installed in an information handling system chassis and before removal of assembly support platform 14, thus reducing the risk of damage to the motherboard by an errant assembly of a CPU and heat sink.

Figure 2:
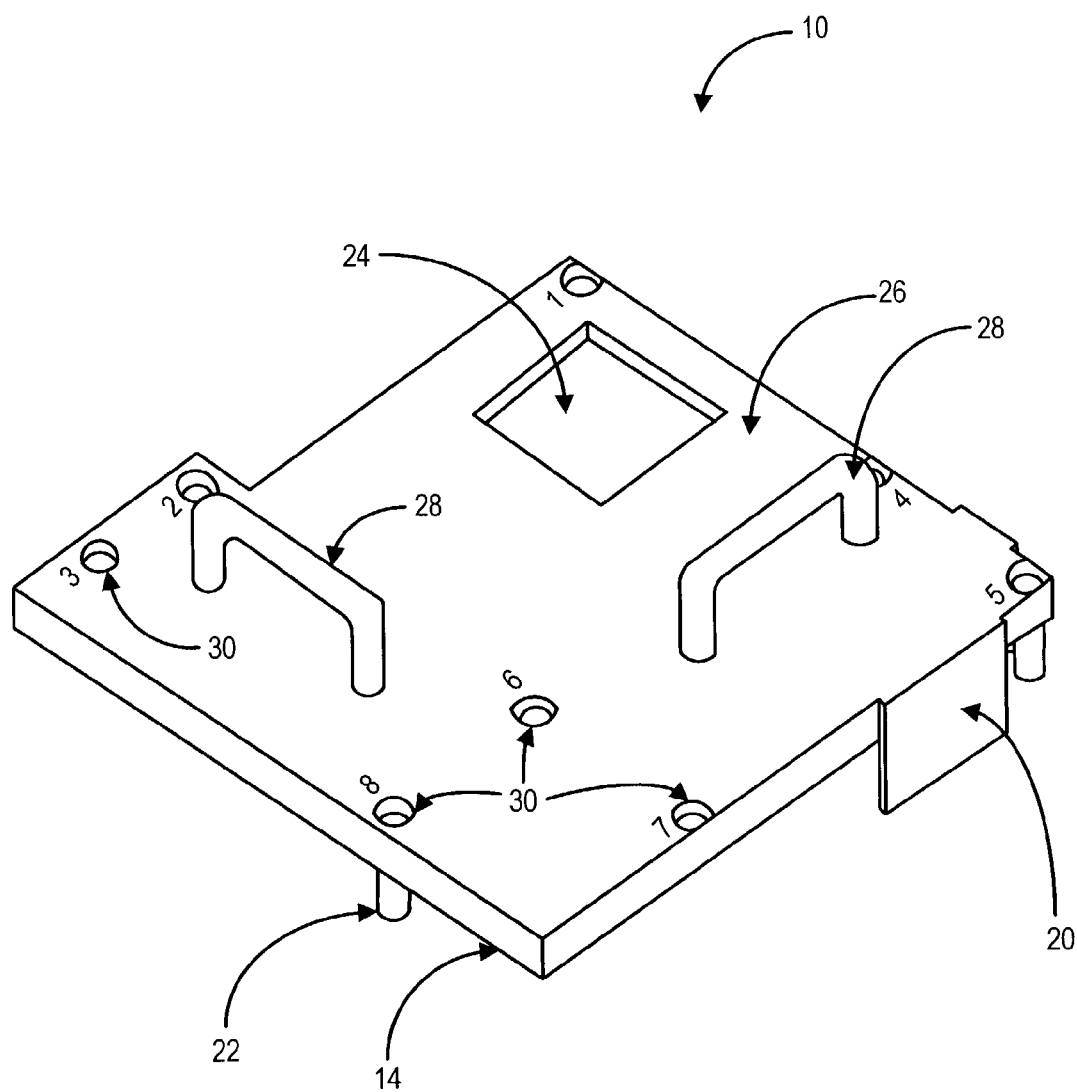
FIG. 2 depicts the support face of a motherboard support assembly platform.

Referring now to FIG. 2, a support face 26 of assembly system 10 for assembly of a motherboard into an information handling system chassis is depicted. Support face 26 has support handles 28 available for an assembler to grasp to move a removably coupled motherboard without direct physical contact with the motherboard. Support handles 28 aid in proper placement of a motherboard in a chassis including a bias to compress EMI shields between a chassis and attachment points to reduce EMI emissions. Attachment device openings 30 formed in support face 26 provide access to motherboard attachment points through attachment device guides 22.

In one embodiment, attachment device openings 30 and attachment device guide 22 form a funnel shape with an opening having a greater diameter at support face 26 than at the point of contact of attachment device guide 22 at a motherboard. The funnel shape aids in the insertion of attachment devices through the opening by providing a larger opening for insertion of an attachment devices and a more narrow opening to limit contact of an attachment device with the motherboard and to prevent contact of attachment tools with the motherboard. In addition, funnel shaped attachment device guides 22 may be constructed of transparent material to create a light pipe effect that enhances an assembler's ability to align an attachment device, such as a screw, during the securing of a motherboard to a chassis. Support face 26 also includes sequence numbering associated with the attachment device openings to indicate a sequence for tightening attachment devices. Tightening in the proper sequence reduces the risk of warping of the motherboard.

Figure 3:
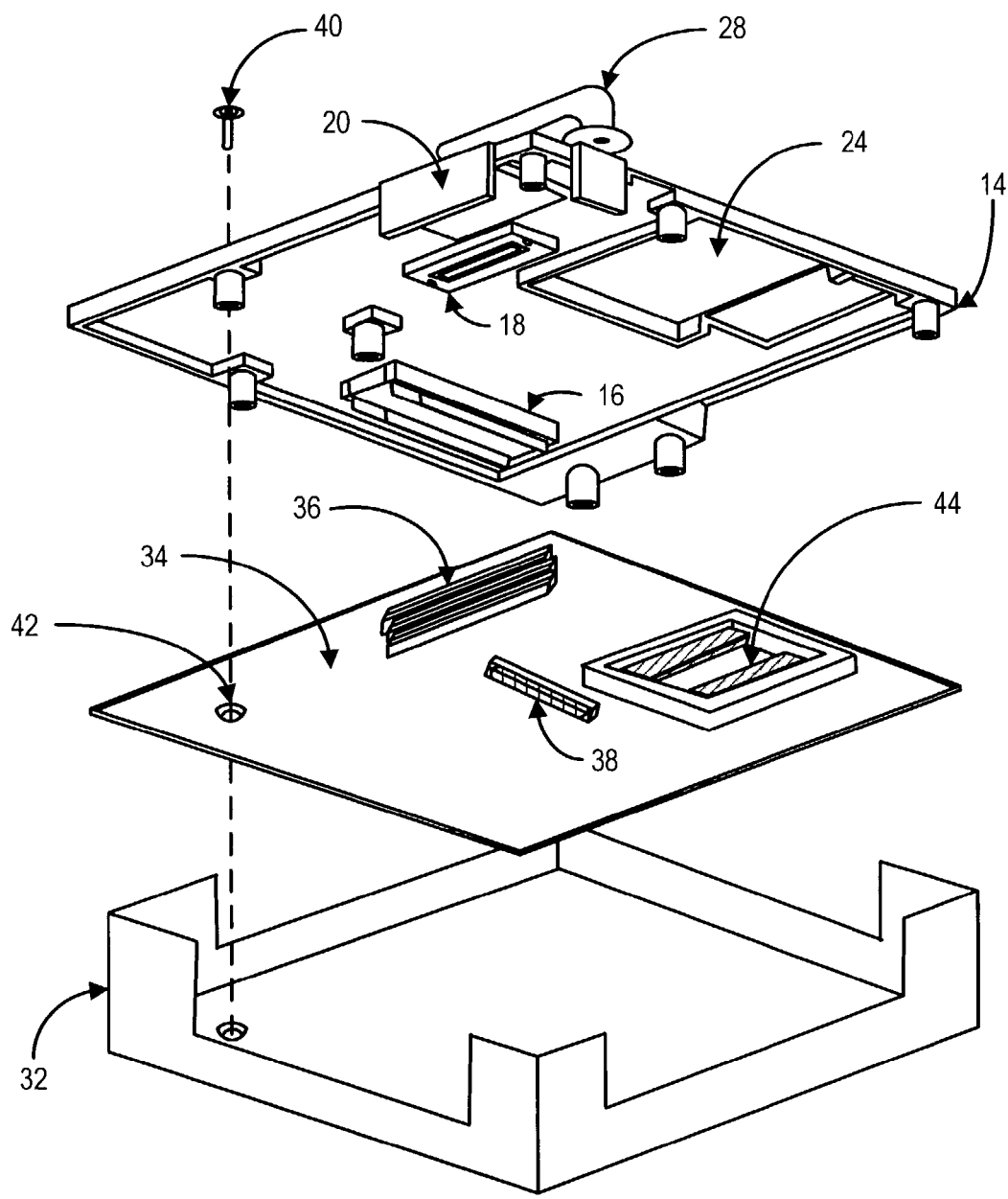
FIG. 3 depicts a blow-up view of a support assembly platform arranged to assemble a motherboard into an information handling system chassis.

Referring now to FIG. 3, a blow-up view of assembly system 10 arranged to assemble a motherboard into an information handling system chassis 32 is depicted. Assembly platform 14 aligns with a motherboard 34 to insert PCI card simulated electronic connectors 16 into motherboard PCI slots 36 and simulated mating connector 18 into motherboard mating connector 38. Once assembly support platform 14 couples with motherboard 34 through the coupling of the electronic connectors, motherboard 34 is moved into an assembly position within information handling system chassis 32 by moving assembly support platform 14 with support handles 28. Assembly support platform 14 has a footprint that approximates that of motherboard 34 so that during placement of motherboard 34 in chassis 32, the outer perimeter of assembly support platform 14 reduces the risk of impacting motherboard 34 into chassis 32. Motherboard 34 is secured to chassis 32 with attachment devices 40, such as screws, that are inserted through attachment device openings 30, attachment device guides 22 and motherboard attachment device openings 42. A CPU may then be inserted into CPU socket 44 of motherboard 34 through CPU opening 24. After motherboard 34 is secured to chassis 32, assembly support platform 14 is removed from motherboard 34 by pulling on support handles 28 to decouple the simulated electronic connectors of assembly platform 14 from the electronic connectors of motherboard 34 for removing assembly support platform 14 from chassis 32 to leave the assembled motherboard.

Although the present invention has been described in detail, it should be understood that various changes, substitutions and alterations can be made hereto without departing from the spirit and scope of the invention as defined by the appended claims.

What is claimed is:

1. A method for assembly of a motherboard into an information handling system chassis, the method comprising:
  inserting simulated electronic connectors of an assembly platform into electronic connectors of the motherboard;
  supporting the motherboard with the assembly platform by the coupling of the simulated electronic connectors to the motherboard electronic connectors;
  moving the motherboard into the information handling system chassis with the assembly platform;
  securing the motherboard to the information handling system chassis; and
  removing the assembly platform from the motherboard by pulling the assembly platform from the motherboard to de-couple the simulated electronic connectors from the motherboard electronic connectors.

2. The method of claim 1 wherein securing the motherboard further comprises:
  inserting attachment devices through openings of the assembly platform; and
  securing the motherboard to the information handling system chassis with an attachment tool that engages the attachment devices through the assembly platform openings.

3. The method of claim 2 further comprising:
  labeling the openings with attachment sequence numbers; and
  securing the attachment devices in the order of the attachment sequence numbers.

4. The method of claim 1 further comprising:
  aligning the assembly platform with the motherboard by placing alignment guides associated with assembly platform in contact with the perimeter of the motherboard.

5. The method of claim 1 further comprising:
  inserting a processor into the motherboard through an opening of the assembly platform.

* * * * *